United States Patent [19]
Atwell

[11] Patent Number: 5,943,471
[45] Date of Patent: *Aug. 24, 1999

[54] SOLID PRECURSOR INJECTOR APPARATUS AND METHOD

[75] Inventor: David R. Atwell, Boise, Id.

[73] Assignee: Micron Technology, Inc., Boise, Id.

[*] Notice: This patent is subject to a terminal disclaimer.

[21] Appl. No.: 09/080,827

[22] Filed: May 18, 1998

Related U.S. Application Data

[63] Continuation of application No. 08/622,820, Mar. 27, 1996, Pat. No. 5,764,849.

[51] Int. Cl.$^6$ .............................. A01G 13/06; C23C 16/00
[52] U.S. Cl. ........................... 392/386; 118/726; 505/730
[58] Field of Search ................................. 392/386, 387, 392/388, 389; 118/715, 726, 727; 427/592, 587; 505/730, 732

[56] References Cited

U.S. PATENT DOCUMENTS

| | | | |
|---|---|---|---|
| 4,389,973 | 6/1983 | Suntola et al. | 118/726 |
| 4,813,373 | 3/1989 | Demay et al. | 118/726 |
| 4,854,264 | 8/1989 | Noma et al. | 118/726 |
| 4,942,057 | 7/1990 | Steinwandel et al. | 118/726 |
| 5,016,566 | 5/1991 | Levchenko et al. | 118/726 |
| 5,204,314 | 4/1993 | Kirlin et al. | 118/726 |
| 5,447,569 | 9/1995 | Hiskes et al. | 118/726 |
| 5,541,407 | 7/1996 | Leone et al. | 118/726 |
| 5,764,849 | 6/1998 | Atwell | 392/386 |

Primary Examiner—Teresa Walberg
Assistant Examiner—Sam Paik
Attorney, Agent, or Firm—Kirkpatrick & Lockhart LLP

[57] ABSTRACT

An apparatus and method are provided for effectively and controllably vaporizing solid material, in general, and specifically, solid precursor material for chemical phase deposition processes. The apparatus includes a hollow container member, capable of retaining solid material and having a longitudinal axis passing through a substantially open first end, that is reciprocally injected at a controlled rate through a heater capable of vaporizing the solid material so that vaporized material passes through the first end along the longitudinal axis of the container member and into the reaction chamber. Preferably, the apparatus includes a hollow body capable of pressure containment that is in fluid communication with the reaction chamber and an rod-shaped injector slidably disposed through the hollow body suitable for injecting the container member through the body and the injector is driven external to the body using a stepper motor. It is also preferred that the body have first and second sections consisting of a load lock and a tubing member, respectively, that can be isolated through the use of a gate valve. Preferably, the container member also includes a removable cap that is capable of sealing and retaining solid CVD precursor material in the container member and a moveable arm is provided through the load lock for engaging the cap to allow for its removal from the container member. Preferably, the container member is horizontally injected through a heater chamber into an inlet port in a reaction chamber.

30 Claims, 1 Drawing Sheet

SOLID PRECURSOR INJECTOR APPARATUS AND METHOD

This a continuation application of U.S. patent application Ser. No. 08/622,820, filed on Mar. 27, 1996, now U.S. Pat. No. 5,764,849.

BACKGROUND OF THE INVENTION

Field of the Invention

The present invention relates generally to the vaporization of solids. More particularly, the present invention relates to an apparatus and method for vaporizing solid precursor material and injecting the vaporized material into a chemical vapor deposition reactor.

Description of the Invention Background

Chemical vapor deposition (CVD) is known as a technique for forming solid films on a substrate by the reaction of vapor phase chemicals near and preferably on the surface of the substrate to produce a solid film. CVD techniques have been particularly useful in the microelectronics industry because CVD techniques can be used to reliably produce extremely thin films, or layers, having good surface coverage characteristics and structural uniformity. In the production of electronic devices, CVD techniques are used to selectively deposit layers on a large silicon wafer-shaped substrate, or wafer, to form a plurality of complex electronic circuit elements separated by narrow streets. The wafers are then cut along the streets to separate the individual elements into chips, or dies, and leads are attached to form the electronic devices.

In general, CVD techniques involve the delivery of gaseous reactants to the surface of a substrate where chemical reactions takes place under temperature and pressure conditions that are favorable to the thermodynamics of the desired reaction. The type and composition of the layers that can be formed using CVD is limited by the ability to deliver the reactants or reactant precursors to the surface of the substrate. Various liquid reactants and precursors are successfully used in CVD applications by delivering the liquid reactants in a carrier gas. In liquid reactant CVD systems, the carrier gas is typically bubbled at a controlled rate through a container of the liquid reactant so as to saturate the carrier gas with liquid reactant and the saturated carrier is then transported to the reaction chamber.

Analogous attempts have been made to deliver solid reactants to a CVD reaction chamber, but with much less success. In the solid delivery devices, the carrier gas is passed through a chamber containing volatile solid reactants, or precursors, at conditions conducive to the volatilization, or vaporization, of the solid. The carrier gas mixes with the vaporized solid and the vaporized solid is transported with the carrier gas to the reaction chamber. However, this procedure has been unsuccessful in reliably and reproducibly delivering solid precursor to the reaction for a number of reasons. The major problems with the technique are centered on the inability to consistently contact the carrier gas with the solid material due to the fact that, as a solid is vaporized, the amount of solid changes with time as well as the shape and morphology of the remaining solid. Because of the difficulty in delivering a predictable amount of solid precursor to a CVD reaction chamber, the use of solid reactants is currently very limited and the reactions that would normally be performed using solid precursors are currently performed using alternative liquid and gas precursors or reactants.

The relative inability to deliver solid precursor has limited the types of the material that can be deposited using CVD techniques. One apparatus that has been developed to more consistently deliver solid precursor to a metal oxide CVD (MOCVD) reaction chamber for producing superconducting thin film is disclosed in U.S. Pat. No. 5,447,569 issued to Hiskes. In the Hiskes apparatus, the solid material is packed into a tube, which is vertically positioned and movable by means of a magnetic support structure within one leg of a quartz U-shaped conduit. The other leg of the conduit is attached to the MOCVD reaction chamber. The tube is plugged at the bottom end (nearest to the reaction chamber) and is provided with a plurality of longitudinal slits extending over the length of the tube. The vaporization of the solid material within the tube is controlled by moving the tube through a band of heaters operated so as to only locally heat and vaporize the material in the immediate vicinity of the heaters. The vaporized material must exit the tube perpendicularly to the longitudinal axis of the tube and via the slits because the end of the tube is plugged. As stated in the Hiskes patent at column 6, lines 63–64, the key feature is that the feed tube moves vertically downward into the heating zone. This feature is required so that nonvolatile constituents in the solid material move downwardly away from the unvaporized material and are retained in the plugged end, thereby requiring that the vaporized material exit perpendicularly to the longitudinal axis of the tube.

The technique of the Hiskes patent provides certain improvements over the prior art methods of delivering solid precursors to a CVD reaction chamber. However, the apparatus and technique of the Hiskes patent are somewhat limited in application resulting from the required orientation of the tube and the necessity of having slits in the tube to allow the vaporized material to exit the tube. For instance, solid precursors that are unstable in oxygenated environments can not be easily provided for in the slit tube design. Also, the vertical orientation of the tube combined with the vaporization of the material from the bottom of the tube requires that the material be fairly tightly packed into the tube to prevent unvaporized material from falling within the tube as the material located below it in the tube is vaporized, thereby removing the support for the above material. This effect will be accentuated by the heating of the material from the outermost radius of the tube toward the central axis of the tube that will tend to initially vaporize the material nearest to the tube wall that provides support for the cross section of the tube, when the powdered solid is packed in the tube. The potential instability in the tube material can be diminished through the use of nonvolatile solid dispersants. The dispersants act as a support structure for the volatile solid precursors in the tube, so that when the volatile solids are vaporized, the aforementioned structural instabilities in the powder do not result. While the dispersants are beneficial in providing structural support, the benefit is not derived without a substantial penalty. Because the dispersant must occupy a sufficient volume of the tube to act as a support, the amount of volatile solid that can be loaded into the tube is greatly diminished requiring substantially longer tube spans to provide a given mass of volatile material. For example, the Hiskes patent at column 6, lines 30–32 provides for typical volatile solid percentages ranging from 1–10%. In addition, the heat input necessary to vaporize the volatile material will be significantly more than the heat of vaporization due to the need to heat the nonvolatile dispersant to the vaporization temperature along with the volatile material. Also, the solid that has been vaporized within the nonvolatile dispersant must diffuse through the nonvolatile material to exit the tube via the longitudinal slits in a direction perpendicular to gravity and therefore unaided by the buoyancy force, although the application of a vacuum downstream of the tube should be a compensating factor. An additional complicating factor is potential for condensation and solidification of the volatile solid near the entrance to the heating section, where vaporized solid is contacted by cold carrier gas. The condensed solid may not necessarily be vaporized lower in the tube, unless the solidification takes place on a wall, but may accumulate in the conduit.

The present invention is directed to an apparatus and method for vaporizing solid precursor and reactant material and delivering the vaporized material to a CVD reactor which overcomes, among others, the above-discussed problems so as to provide a more efficient method for using solid precursors and reactants in the formation of thin layers on substrate using CVD techniques.

SUMMARY OF THE INVENTION

The above objects and others are accomplished by an apparatus and method in accordance with the present invention. The apparatus includes a hollow container member, suitable for retaining solid material, such as CVD precursor material, and further includes a longitudinal axis passing through a substantially open first end. The container preferably is reciprocally injected at a controlled rate through a heater to vaporize the solid material and allow the vaporized material to pass through the first end along the longitudinal axis of the container member and into the reaction chamber. Preferably, the apparatus includes a hollow body capable of pressure containment that is in fluid communication with the reaction chamber and a rod-shaped injector slidably disposed through the hollow body suitable for injecting the container member through the body and the injector is driven external to the body using a stepper motor.

It is also preferred that the body have first and second sections consisting of a load lock and a tubing member, respectively, that can be isolated through the use of a gate valve. Preferably, the container member also includes a removable cap that is capable of sealing and retaining solid CVD precursor material in the container member and a movable arm is provided through the load lock for engaging the cap to allow for its removal from the container member. Preferably, the container member is horizontally injected through a heater chamber into an inlet port in a reaction chamber.

Accordingly, the present invention increases the efficiency of CVD techniques for producing uniform layers on substrates because the vaporized material is transmitted in controlled quantities from the end of the hollow container and relative movement between the container and the heater chamber can be controlled so as to control material vaporization. Also, the precursor material is not exposed to undesirable contamination because the container is sealed by use. These and other details, objects, and advantages of the invention will become apparent as the following detailed description of the present preferred embodiment thereof proceeds.

BRIEF DESCRIPTION OF THE DRAWINGS

Preferred embodiments of the present invention will be described in greater detail with reference to the accompanying drawings, wherein like members bear like reference numerals and wherein.

DETAILED DESCRIPTION OF THE PREFERRED EMBODIMENTS

Figure 1:
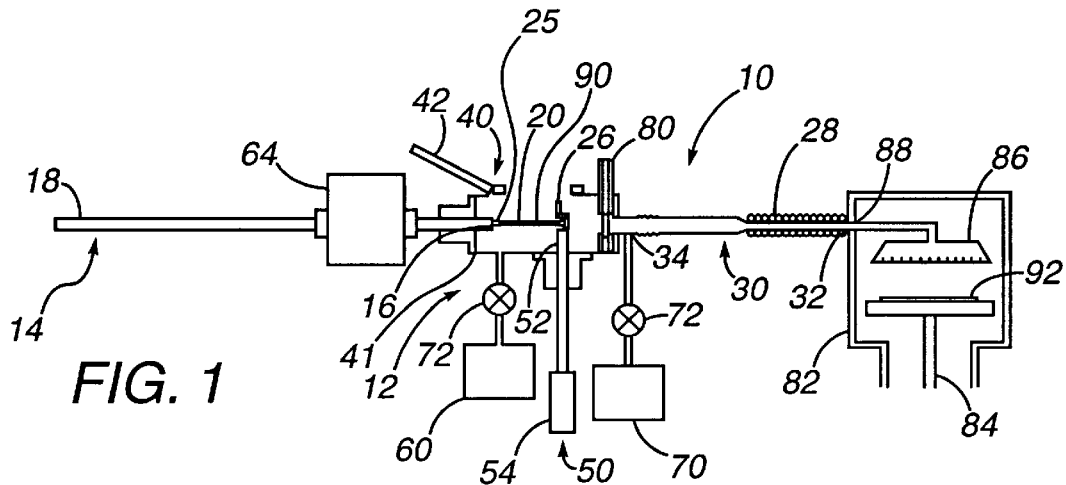
FIG. 1 is a side view of the apparatus during loading of the hollow container member into the load lock.

The operation of the apparatus 10 will be described generally with reference to the drawings for the purpose of illustrating present preferred embodiments of the invention only and not for purposes of limiting the same. In accordance with the present invention, the apparatus 10 generally provides for effectively and controllably vaporizing solid material, specifically, solid precursor material for CVD processes. In the specific case, the vaporized precursor is delivered to a chemical vapor deposition reaction chamber. Solid material 90 is contained in a hollow tube-like container member 20 having a longitudinal axis passing through a substantially open first end 22. The hollow member 20 is attached to an injector 14 that is in communication with an inlet port 88 of a reaction chamber 82 containing a substrate support 84 supporting a substrate 92. The injector 14 is used to move the container member 20 in a controlled manner through a heater 28 that vaporizes the solid material 90, as the vaporized material is drawn into the reaction chamber 82 by a pressure differential between the chamber 82 and the hollow container member 20 and/or by means of carrier gas (described below).

In a preferred embodiment, the hollow member 20 has an open first end 22 and a closed second end 24 that attaches to the injector 14 by means of a bayonet coupling 25. As such, a longitudinal axis of the container extends between the first and second ends 22 and 24, respectively. Volatile solid precursor material 90 is packed inside the container member 20 so that when the material is vaporized, the volatilized solid is drawn out of the open end 22 parallel to the longitudinal axis of the container member 20. Examples of precursor material 90 include Cyclopentadienylcycloheptatrienyltitanium ($C_p$TiCht), Aluminumtrichloride, Titaniumiodide, Cyclooctatetraenecyclopentadienyltitanium, Biscyclopentadiemyltitaniumdiazide, and Tungsten carbonyl that are useful in the deposition of metal films. Preferably, a cap 26 is provided to form an air tight seal on the open first end 22 of the container member 20, thereby providing for the handling of precursor materials 90 that may be unstable in a given environment, such as air. The container member 20 is preferably of a sufficient length that, combined with internal dimensions of the container member 20, provides the required material capacity to perform at least one CVD operation. The inside of the container member 20 is preferably cylindrically shaped to provide for uniform radial heating of the material 90 as it passes through the heater 28. The preferred length to diameter aspect ratio of the inside of the container member 20 is dependent upon the heat of vaporization of the particular material 90 being vaporized, as well as the rate of injection; however, it is preferred that the diameter of the container member 20 be sufficiently small, e.g. 2 mm, that the material 90 will be vaporized uniformly along its cross section perpendicular to the longitudinal axis. Suitable aspect ratios are in the range from 1 to 100. The container member 20 must be formed from a material having sufficient thermal resistance to withstand the high temperatures required to vaporize most solid precursors (i.e. 30° C. to 800° C.). The container members 20 are preferably formed from inexpensive materials, such as glass, so that the container members 20 can be readily replaced following use in the apparatus 10. However, depending upon the solid precursor 90 to be vaporized, it may be beneficial to construct the container member 20 using a material, such as alumina, sapphire quartz, or ceramic materials.

In addition to instability of some solid precursors in air, other problems with solid precursors include the decomposition of the solid precursors at temperatures near the vaporization temperature and the formation of nonvolatile decomposition by products. The use of container member 20 having an open end 22 forces the vaporized solid to travel parallel to the longitudinal axis of the member 20 as it is drawn out of the member 20 by the carrier gas and the pressure differential with the reaction chamber 82. If the vaporized solid decomposes as it moves through the member 20, decomposition products will remain in the member 20 and serve to establish an equilibrium with the subsequently vaporized solids, thereby lessening the extent of decomposition. Modifications of the open end design can be made by one skilled in the art, such as using a hollow member containing an enclosed annular region in fluid communication with the inside of the hollow member 20 to allow nonvolatile liquid decomposition products to be separated from the precursor material.

Preferably, the injection of the hollow member 20 through the heater 28 to vaporize the material 90 is performed using an injector 14 and a hollow body 12 having a first section 40 and a second section 30. The injector is preferably rod shaped having a longitudinal axis and is slidably disposable in the hollow, sectioned body 12. The injector 14 has an internal end 16 that attaches to the container member 20 so as to align the respective longitudinal axes and reciprocally moves within the body 12 and an external portion 18 that extends outside of the body 12 that is used to impart the reciprocal motion to the injector 14 and the container member 20.

In a preferred embodiment, a load lock 40 is used to provide access to the body 12 to load and unload the hollow member 20 without having to disassemble the injector 14 and body 12. The load lock 40 contains a vacuum seal directly opposite an isolation valve 80 through which the external portion 18 of the injector 14 extends out of the load lock 40. In a preferred embodiment, access into the load lock 40 is provided by a load lock door 42 that preferably contains a pressure resistant window to allow for viewing into the load lock 40. The door 42 is preferably located perpendicular to and aligned with the longitudinal axis of the hollow member 20 to facilitate the loading and unloading of the hollow member 20.

Also in a preferred embodiment, a cap remover 50 is provided to remove the cap 26 from the open end 32 of the container member 20. Preferably, the cap remover 50 can be reciprocated perpendicular to the longitudinal axis of the container member 20 so that the cap remover 50 can be aligned with the container member 20 in order to remove the cap 26 and can be then be moved to a second position out of the path of the reciprocating injector 14 and hollow member 20. A remover portion 52 of the cap remover 50 is sized so that when the cap remover 50 is in a first position aligned with the container member 20, the remover portion 52 is capable of engaging the removable cap 26 on the open end 22 of the container member 20 when the container member 20 is reciprocated along its longitudinal axis toward the cap remover 50. Cap remover portion 52 is capable of retaining the cap 26, such as through the use of an rubber O-ring, when the container member 20 is reciprocated away from the cap remover 50. Preferably, the cap remover 50 consists of an external motor portion 54 that extends through a vacuum seal in the load lock 40 to provide for reciprocation of the cap remover 50 from outside of the load lock 40 using conventional methods, such as mechanically through the use of an actuator.

Preferably, a vacuum pump 60 or any other conventional equipment for drawing a vacuum is attached to the load lock 40 through a valve 72. In this manner, the load lock 40 can be evacuated prior to removing the cap 26 from the hollow member 20 and opening the isolation valve 80. Reciprocation of the injector 14 and the container member 20 are preferably performed using a stepper motor 64 attached to the external portion 18 of the injector 14. Also preferably, after the load lock 40 is evacuated, an inert gas such as argon, helium or nitrogen, depending on the precursor materials, can be injected into the load lock 40 through gas port 41 to raise the pressure to atmospheric conditions prior to removal of the cap 26.

Figure 2:
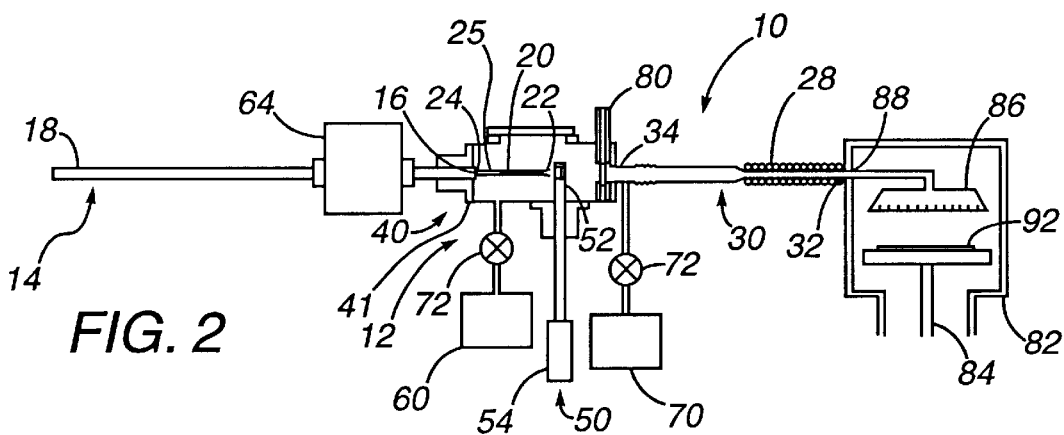
FIG. 2 is a side view of the apparatus after removal of the cap from the hollow member; and, FIG. 3 is a side view of the apparatus when the hollow member is entering the heater chamber.
Figure 3:
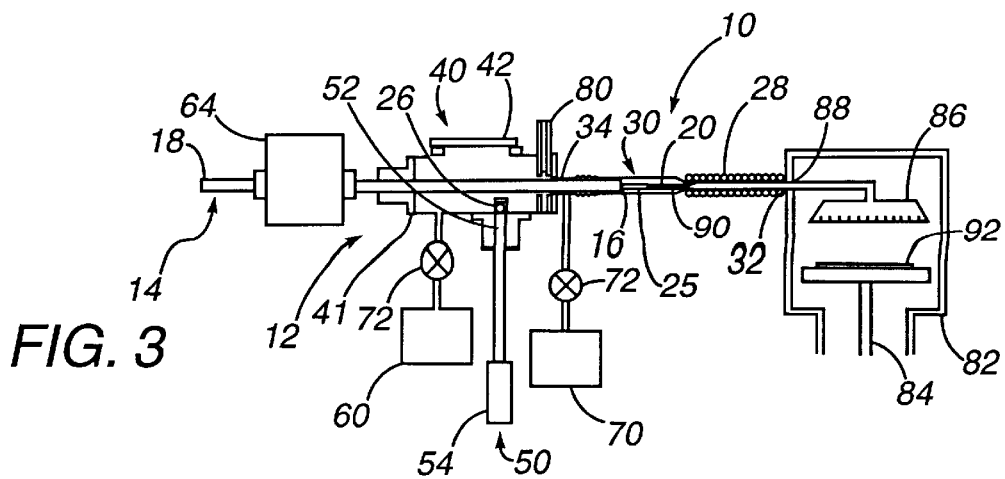

In a preferred embodiment, the second section of the body 12 generally includes a tubing member 30 that is attached on one end to the inlet port 88 of the reaction chamber 82 and attached on the other end to the load lock 40 via the isolation valve 80. The external portion 18 of the injector 14 extends out of load lock 40 and the internal end 16 and container member 20 are capable of reciprocally moving through the load lock 40 and tubing member 30. As shown in FIGS. 1–3, the tubing member portion 30 of body 12 has a first end 32 that is either directly attached or integral with a gas reactant feed system of the reaction chamber 82, shown for illustrative purposes as a shower head assembly 86 In a preferred embodiment, the heater 28 is disposed around the first end 32 of tubing member 30 adjacent to the reactor inlet port 88, so that the condensation of the vaporized precursor material 90 is minimized or eliminated.

In a preferred embodiment, the tubing member 30 has a second end 34 that has a larger diameter than the first end 32 that is within the heater 28. The heater 28 is preferably a tube heater or, less preferably, heat tape. The inner diameter of the tubing member 30 within the heating section is minimized to provide for the most effective heat transfer from the heater 28 through the tubing member 30 and into the container member 20, while providing clearance around the outside of the container member 20 to provide a flow path for carrier gas in the annular region formed by the outside of the container member 20 and the inside of the tubing member 30. Preferably, the diameter of the tubing member 30 abruptly increases outside of the heater 28 in order to reduce the amount of heat transfer occurring from the walls of the tubing member 30 to the portion of the container member 20 that is outside of the heater 28. The portion of tubing member 30 contained within the heater 28 can be composed of materials such as a metal or glass, and the larger diameter portion of the tubing member 30 outside of the heater 28 is formed from a material such as glass. In addition, it is preferred that the second end 34 of the tubing member 30 is formed of a flexible metal portion for structural strength in the glass to metal seal with the isolation valve 80. The isolation valve 80 can be any valve design suitable to withstanding the pressure differential caused by drawing a vacuum, such as a gate valve.

Preferably, a carrier gas source 70 is attached to the second end 34 through a valve 72 to provide control over the temperature, concentration and flow rate of the gaseous reactants entering the reaction chamber 82. Alternatively, the carrier gas source 70 can be connected to the load lock 40 to facilitate the apparatus 10 with atmospheric pressure CVD reactors. The carrier gas may, for example, be helium, or hydrogen under a pressure of from ½ millitorr to 500 torr.

Alternatively, the container member 20 can be stationary and the heater 28 can either be moved over the length of the container member 20 or the heater 28 can be a sequentially activated heater having varying intensities that define a vaporizing region and relative movement of the vaporizing region of the heater 28 will be used to vaporize the solid precursor material 90.

The operation of the apparatus 10 will be described with reference to FIGS. 1–3, wherein the injector 14 is withdrawn to an initial position so as to extend only into the load lock 40 and the isolation valve 80 is closed blocking communication between the load lock 40 and the tubing member 30. The load lock door 42 is opened and the second end 24 of a hollow container member 20 is attached to the internal end 16 of the injector 14. The cap remover 50 is moved into alignment with the longitudinal axis of the container member 20 and the injector 14. The stepper motor 64 is activated to move the injector 14 and the container member 20 toward the cap remover 50 until the cap 26 on the first end 22 is engaged by the remover portion 52 of the cap 26, as shown in FIG. 1. The load lock door 42 is closed and the vacuum pump 60 is activated to draw a vacuum in the load lock 40, and the inert gas is back filled into the load lock 40. After an equilibrium is established, the stepper motor 64 is activated to move the injector 14 and the container member 20 away from the cap remover 50 until the first end 22 of the container member 20 is removed from the cap 26 which is retained in the remover portion 52 of the cap remover 50, as shown in FIG. 2. Then the vacuum pump is activated to reduce the vacuum in load lock 40, for example to $1 \times 10^{-5}$ torr. The isolation valve 80 is then opened to provide access from the load lock 40 to the tubing member 30. The stepper motor 64 is activated to move the injector 14 and container member 20 through the isolation valve 50 and into tubing member 30 toward the heater 28. The carrier gas is then supplied as necessary and the heater 28 is activated. The stepper motor 64 continues to advance the hollow member 20 through the first end 32 of the tubing member 30 surrounded by the heater 28 until the solid precursor material 90 has been vaporized and drawn out of the open end 22 of the hollow member 20 and carried along with the carrier gas into the reaction chamber 82.

After the solid precursor has been vaporized, the stepper motor 64 is activated to withdraw the injector 14 and the hollow member 20 out of the tubing member 30 and into the load lock 40. The isolation valve 80 is closed to isolate the load lock 40 from the tubing member 30. The load lock 40 is vented to allow the pressure to return to atmospheric and the load lock door 42 is open and the hollow member detached from the injector 14. While the operation of the apparatus 10 was described with reference to use in an low pressure CVD reactor, the apparatus 10 can be analogously employed in other reactors, such as an atmospheric pressure CVD reactor.

Those of ordinary skill in the art will appreciate that the present invention provides significant advantages over the current state of the art for vaporizing solid precursor and delivering the vaporized material to a CVD reactor. In particular, the present invention provides for a controlled vaporization of the solid precursor that does not have to be diluted in nonvolatile support material and significantly reduces the potential condensation of the volatilized solid. Thus, the present invention provides an effective method of vaporizing larger volume of solid precursor material and delivering the volatilized solid to the CVD reactor. While the subject invention provides these and other advantages over the prior art, it will be understood, however, that various changes in the details, materials and arrangements of parts which have been herein described and illustrated in order to explain the nature of the invention may be made by those skilled in the art within the principle and scope of the invention as expressed in the appended claims.

What is claimed is:

1. An apparatus for vaporizing volatile solid precursor material comprising:
    a hollow container member having a substantially open first end and a longitudinal axis passing through said first end, said container member being suitable for retaining solid precursor material;
    a vaporizer placed to selectively vaporize solid precursor material in said container member; and,
    a movable support to move one of said container member and said vaporizer to provide for the vaporization of solid precursor material in said container.

2. The apparatus of claim 1 further comprising removal apparatus configured to remove the vaporized material from said container member.

3. The apparatus of claim 2 wherein said open end of said container member is in fluid communication with a chamber through an inlet and said removal apparatus comprises operating the chamber at a lower pressure than said container member.

4. The apparatus of claim 1 wherein said longitudinal axis is horizontally oriented.

5. An apparatus for vaporizing volatile solid precursor material comprising:
    a hollow container member having a substantially open first end and a longitudinal axis passing through said first end, said container member being suitable for retaining solid precursor material;
    a vaporizer placed to selectively vaporize solid precursor material in said container member; and,
    a movable support comprising a reciprocatable support to displace said vaporizer along said container member to provide for the vaporization of solid precursor material in said container.

6. An apparatus for vaporizing volatile solid precursor material comprising:
    a hollow container member having a substantially open first end and a longitudinal axis passing through said first end, said container member being suitable for retaining solid precursor material;
    a vaporizer placed to selectively vaporize solid precursor material in said container member, said vaporizer comprising a sequentially activated heater suitable for providing a moving vaporizing region along said container; and,
    a controller for sequentially activating said heater to move the vaporizing region along said container to provide for the vaporization of solid precursor material in said container.

7. An apparatus for vaporizing volatile solid precursor material comprising:
    a hollow container member having a substantially open first end and a longitudinal axis passing through said first end, said container member being suitable for retaining solid precursor material;
    a vaporizer placed to selectively vaporize solid precursor material in said container member; and,
    a movable support to move said container member to provide for the vaporization of solid precursor material in said container, said movable support comprising:

an injector suitable for supporting said container member; and, a reciprocator to displace said injector and said container member along said vaporizer to provide for the vaporization of solid precursor material in said container.

8. The apparatus of claim 7 further comprising a hollow body having an open inlet end and a sealable injecting end, said container member and said injector being slidably disposed in said body and said vaporizer being coupled to said body.

9. The apparatus of claim 8 further comprising an isolator to isolate said hollow body from said open inlet end.

10. The apparatus of claim 9 wherein:

said hollow body is suitable for pressure containment; and, said apparatus further comprises a pressure controller to control the pressure in said hollow body.

11. The apparatus of claim 10 further comprising at least one gas source attached to said hollow body.

12. The apparatus of claim 11 wherein said hollow body further comprises a first section including said injecting end in communication with a second section including said inlet end.

13. The apparatus of claim 12 wherein said isolator is disposed between said first and second sections.

14. The apparatus of claim 13 wherein:

said first section comprises a load lock, wherein said injecting end comprises a portion thereof;

said second section comprises a tubing member having a first end attached to said isolator and wherein inlet end comprises a portion thereof; and, said isolator comprises an isolation valve;

said vaporizer being disposed around said second section in close proximity to said inlet end.

15. The apparatus of claim 14 wherein:

said injector further comprises an external portion that extends through said load lock; and, said injector comprises a stepper motor attached to said external portion of said injector and suitable for reciprocating said injector and said hollow member along said longitudinal axis through said load lock and said tubing member.

16. The apparatus of claim 15 further comprising:

a removable cap attached to said first end suitable for sealing said first end;

a cap remover slidably disposed through said load lock, said cap remover being movable to a first position so as to engage said removable cap on said first end of said container member when said hollow member is reciprocated along said longitudinal axis toward said cap remover and said cap remover being suitable for retaining said cap when said container member is reciprocated away from said cap remover, and said cap remover being movable to a second position so as to not impede reciprocation of said injector and said container member; and, said load lock further comprises a load lock port sized to provide access to said load lock to allow said container member to be removed from said load lock.

17. The apparatus of claim 15 wherein said vaporizer comprises a tube heater coupled to said second section.

18. An apparatus for vaporizing volatile solid precursor material comprising:

a hollow container member having a substantially open first end and a longitudinal axis passing through said first end, said container member being suitable for retaining solid precursor material;

a vaporizer placed to selectively vaporize solid precursor material in said container member;

a movable support to move said container member to provide for the vaporization of solid precursor material in said container, said movable support comprising an injector suitable for supporting said container member, and a reciprocator to displace said injector and said container member along said vaporizer to provide for the vaporization of solid precursor material in said container;

a hollow body suitable for pressure containment and having an open inlet end and a sealable injecting end, said container member and said injector being slidably disposed in said body and said vaporizer being coupled to said body, said hollow body further comprising a first section including said injecting end in communication with a second section including said inlet end, and an isolation valve disposed between said first and second sections to isolate said hollow body from said open inlet end, said first section comprising a load lock wherein said injecting end comprises a portion thereof, and said second section comprising a tubing member having a first end attached to said isolation valve and wherein said inlet end comprises a portion thereof, and said vaporizer being disposed around said second section in close proximity to said inlet end;

a pressure controller to control the pressure in said hollow body;

and wherein said injector further comprises an external portion that extends through said load lock; and, said injector comprises a stepper motor attached to said external portion of said injector and suitable for reciprocating said injector and said hollow member along said longitudinal axis through said load lock and said tubing member.

19. A method of injecting volatile solid material into a chamber, comprising:

providing a hollow member containing volatile solid precursor material and having a substantially open first end in communication with the chamber and a longitudinal axis passing through the open first end, said hollow member coupled to an injector in a hollow body attached to the chamber;

advancing said injector and said hollow member proximate a heating assembly;

vaporizing the solid material in said hollow member as said member is advanced proximate said heating assembly; and allowing the vaporized material to exit the first end generally parallel to the longitudinal axis of the chamber.

20. The method of claim 19, wherein the hollow body is suitable for pressure containment, further comprising:

isolating the hollow body prior to attaching the container member;

evacuating the hollow body after attaching the container member; and, reestablishing fluid communication between the hollow body and the chamber prior to advancing the container member into the vaporizing heater.

21. The method of claim 20 further comprising introducing gaseous species into the hollow body after evacuating the hollow body to equilibrate the hollow body and the chamber.

22. The method of claim 21 further comprising:

placing the solid material in the hollow container member;

sealing the solid material in the hollow container member by placing a removable cap over the first end prior to attaching the container member to the injector; and, removing the cap after evacuating the hollow body.

23. The method of claim 22 wherein said placing the solid material in the container and said sealing the container member are performed in a controlled environment.

24. The method of claim 22 wherein said removing the cap further comprises:

aligning a cap remover with the cap on the open end along the longitudinal axis of the container member;

advancing the container member with the injector in the direction of the open first end until the cap engages the cap remover;

retracting the container member with the injector until the open end of the container member is disengaged from the cap and the cap remains in the cap remover after evacuating the hollow body; and, moving the cap remover out of alignment with the container member along the longitudinal axis prior to advancing the container member into the vaporizing heater.

25. A method of injecting volatile solid material into a chamber, comprising:

providing a hollow member containing volatile solid precursor material and having a substantially open first end in communication with the chamber and a longitudinal axis passing through the open first end, said hollow member coupled to a hollow body attached to the chamber;

adjusting a heating assembly to apply heat advancing along said hollow member;

vaporizing the solid material in said hollow member as heat is advanced by said heating assembly along said hollow member; and allowing the vaporized material to exit the first end generally parallel to the longitudinal axis of the chamber.

26. The method of claim 25, wherein the hollow body is suitable for pressure containment, further comprising:

isolating the hollow body prior to attaching the container member;

evacuating the hollow body after attaching the container member; and, reestablishing fluid communication between the hollow body and the chamber prior to advancing the container member into the vaporizing heater.

27. The method of claim 26 further comprising introducing gaseous species into the hollow body after evacuating the hollow body to equilibrate the hollow body and the chamber.

28. The method of claim 27 further comprising:

placing the solid material in the hollow container member;

sealing the solid material in the hollow container member by placing a removable cap over the first end prior to attaching the container member to the injector; and, removing the cap after evacuating the hollow body.

29. The method of claim 28 wherein said placing the solid material in the container and said sealing the container member are performed in a controlled environment.

30. The method of claim 28 wherein said removing the cap further comprises:

aligning a cap remover with the cap on the open end along the longitudinal axis of the container member;

advancing the container member with the injector in the direction of the open first end until the cap engages the cap remover;

retracting the container member with the injector until the open end of the container member is disengaged from the cap and the cap remains in the cap remover after evacuating the hollow body; and, moving the cap remover out of alignment with the container member along the longitudinal axis prior to advancing the container member into the vaporizing heater.

* * * * *